(12) United States Patent
Liao

(10) Patent No.: US 7,815,455 B2
(45) Date of Patent: Oct. 19, 2010

(54) ELECTRICAL CONNECTOR ASSEMBLY

(75) Inventor: Fang-Jwu Liao, Tu-Cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 12/502,799

(22) Filed: Jul. 14, 2009

(65) Prior Publication Data

US 2010/0009556 A1 Jan. 14, 2010

(30) Foreign Application Priority Data

Jul. 14, 2008 (TW) .................................. 97212481
Sep. 8, 2008 (TW) .................................. 97216189

(51) Int. Cl.
*H01R 13/62* (2006.01)
(52) U.S. Cl. ........................................ 439/331; 439/71
(58) Field of Classification Search ................. 439/331, 439/330, 71, 73
See application file for complete search history.

(56) References Cited

U.S. PATENT DOCUMENTS 7,160,130 B2 1/2007 Ma

| | | | |
|---|---|---|---|
| 2004/0259407 A1* | 12/2004 | Chiang | 439/331 |
| 2006/0057878 A1* | 3/2006 | Szu | 439/331 |
| 2006/0148298 A1* | 7/2006 | Nakao et al. | 439/331 |
| 2007/0077804 A1* | 4/2007 | Ju et al. | 439/331 |
| 2007/0128917 A1* | 6/2007 | Ho | 439/331 |

* cited by examiner

*Primary Examiner*—Hien Vu
(74) *Attorney, Agent, or Firm*—Andrew C. Cheng; Wei Te Chung; Ming Chieh Chang

(57) ABSTRACT

An electrical connector assembly (100) comprises an insulative housing (5) with a plurality of contacts (6) received therein, a lock member (3) assembled on the circuit board (2) and a load plate (1) for pressing the electronic package toward the insulative housing (5). The lock member (3) defines a lock portion (31), the load plate comprises a body portion (12), a first tongue portion (14) and a second tongue portion (15) extending from the body portion (12), the first tongue portion (14) and the second tongue portion (15) can move away from each other to make the first tongue portion (14) and the second tongue portion (15) move to the lower surface of the lock portion (31) to interlock with the lock portion (31).

2 Claims, 8 Drawing Sheets

ELECTRICAL CONNECTOR ASSEMBLY

BACKGROUND OF THE INVENTION

1. Field of the Invention

The present invention relates to an electrical connector assembly, and more particularly, to an electrical connector assembly having an improved load plate to make it easy to close or open.

2. Description of the Prior Art

U.S. Pat. No. 7,160,130 issued to Ma on Jan. 9, 2007 discloses a conventional electrical connector for electrically connecting a CPU with a PCB. The electrical connector comprises a socket body having a number of terminals, a stiffener attached to the socket body, a load plate and a load lever pivotally mounted to two ends of the stiffener respectively. The load plate comprises a body plate and a pressing side with an interlocking element at one end thereof extending forwardly from the body plate. The load lever is formed by bending a single metallic wire and includes a pair of rotary shafts, a locking section disposed between the rotary shafts and an actuating section for rotating the rotary shafts is bent at a right angle with respect to the rotary shafts, a distal end of the actuating section is formed into a U-like shape in order to form a handle for ease of actuation.

When the CPU is assembled to the socket body, the load plate is pivoted to a closed position and is locked by the locking section of the load lever. Thus the load plate exerts a force on the CPU to make a good electronic connection between the CPU and the terminals of the electrical connector.

When the load lever is operated to make the load plate at the closed position, the interlocking element must be lower than the locking section, otherwise, the locking section can not press on the interlocking element, thus the locking section can not drive the load plate to create enough download force for providing a reliable interconnection between the CPU and the socket.

In view of the above, a new electrical connector assembly that overcomes the above-mentioned disadvantages is desired.

SUMMARY OF THE INVENTION

Accordingly, an object of the present invention is to provide an electrical connector assembly having an improved load plate to make it easy to close or open.

To fulfill the above-mentioned object, an electrical connector assembly comprises an insulative housing with a plurality of contacts received therein, a lock member assembled on the circuit board and defining a lock portion and a load plate for pressing the electronic package toward the insulative housing. The load plate comprises a body portion, a first tongue portion and a second tongue portion extending from the body portion, the first tongue portion and the second tongue portion can move away from each other to make the first tongue portion and the second tongue portion move to the lower surface of the lock portion to interlock with the lock portion.

Other objects, advantages and novel features of the invention will become more apparent from the following detailed description when taken in conjunction with the accompanying drawings.

DETAILED DESCRIPTION OF THE PREFERRED EMBODIMENT OF THE INVENTION

Reference will now be made to the drawings to describe the present invention in detail.

Figure 1:
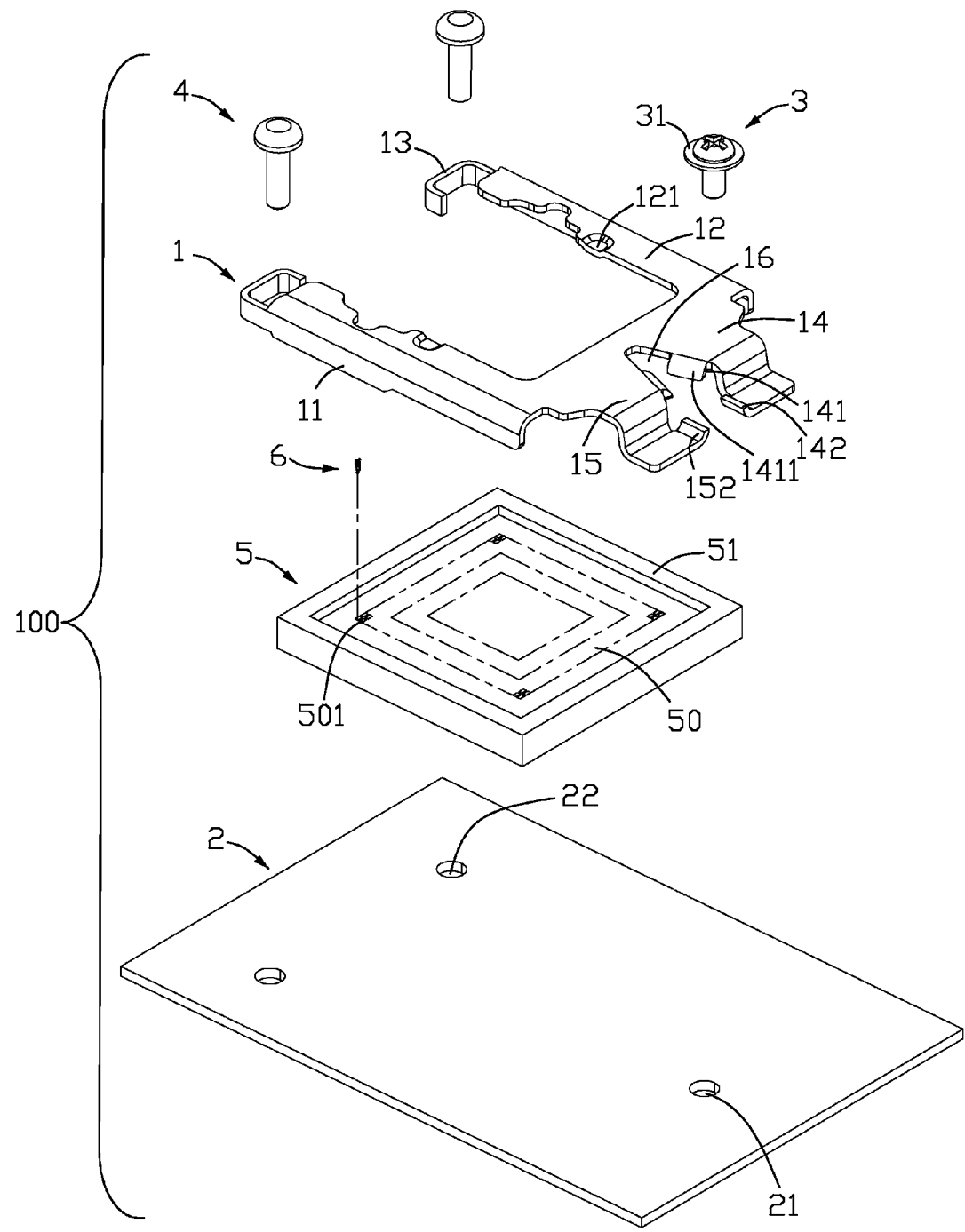
FIG. 1 is an exploded view of an electrical connector assembly in accordance with the first embodiment of the present invention.

Referring to FIG. 1, showing a first embodiment of the prevent invention, the electrical connector assembly 100 is used for electrically connecting an electronic package (not labeled) to a circuit board 2 and comprises an insulative housing 5, a plurality of contacts 6 received in the insulative housing 5, a load plate 1 assembled on the circuit board 2, a number of fix members 4 for fixing the load plate 1 on the circuit board 2 and a lock member 3 assembled on the circuit board 2 to lock the load plate 1.

The insulative housing 8 with a rectangular shape is positioned on the circuit board 2 and comprises a bottom wall 50, four sidewalls 51 extending upwardly from the bottom wall 50 and a receiving space 501 formed by the bottom wall 50 and the sidewalls 51. The receiving space 501 is used to receive the electronic package. The contacts 9 are received in the bottom wall 50 with a contact portion (not labeled) located in the receiving space 501 for electrically connecting with the electronic package. The fix member 4 is positioned adjacent one of the sidewalls 51 of the insulative housing 5.

The load plate 1 is made of metal sheet and comprises a body plate 12, a pair of side plates 11 extend downwardly from the body plate 12, a first tongue portion 14 and a second tongue portion 15 extends forwardly from the body plate 12. There is a V-shaped slot 16 between the first tongue portion 14 and the second tongue portion 15. The first tongue portion 14 and the second tongue portion 15 each has a press portion 141 extending curvedly and downwardly to the slot 16. The two press portions 141 each defines a curved surface 1411 toward each other. There is a first interlock portion 142 extending curvedly and upwardly from the end of the first tongue portion 14 and a second interlock portion 152 extending curvedly to the first interlock portion 142 and then extending upwardly from the end of the second tongue portion 15. An L-shaped fasten portion 13 extends backwardly from the side plate 11.

The fix member 4 and the lock member 3 are screws, and the lock member 3 defines a lock portion 31. The distance between the first interlock portion 142 and the second interlock portion 152 is smaller than the diameter of the lock portion 31 of the lock member 3. The circuit board 2 defines a first hole 21 and two second holes 22. The fix member 4 goes through the second hole 22 and presses on the fasten portion 13 of the load plate 1, thus make the load plate 1 securely located on the circuit board 2. The lock member 3 goes through the first hole 21 to make the lock member 3 securely located on the circuit board 2.

Figure 2:
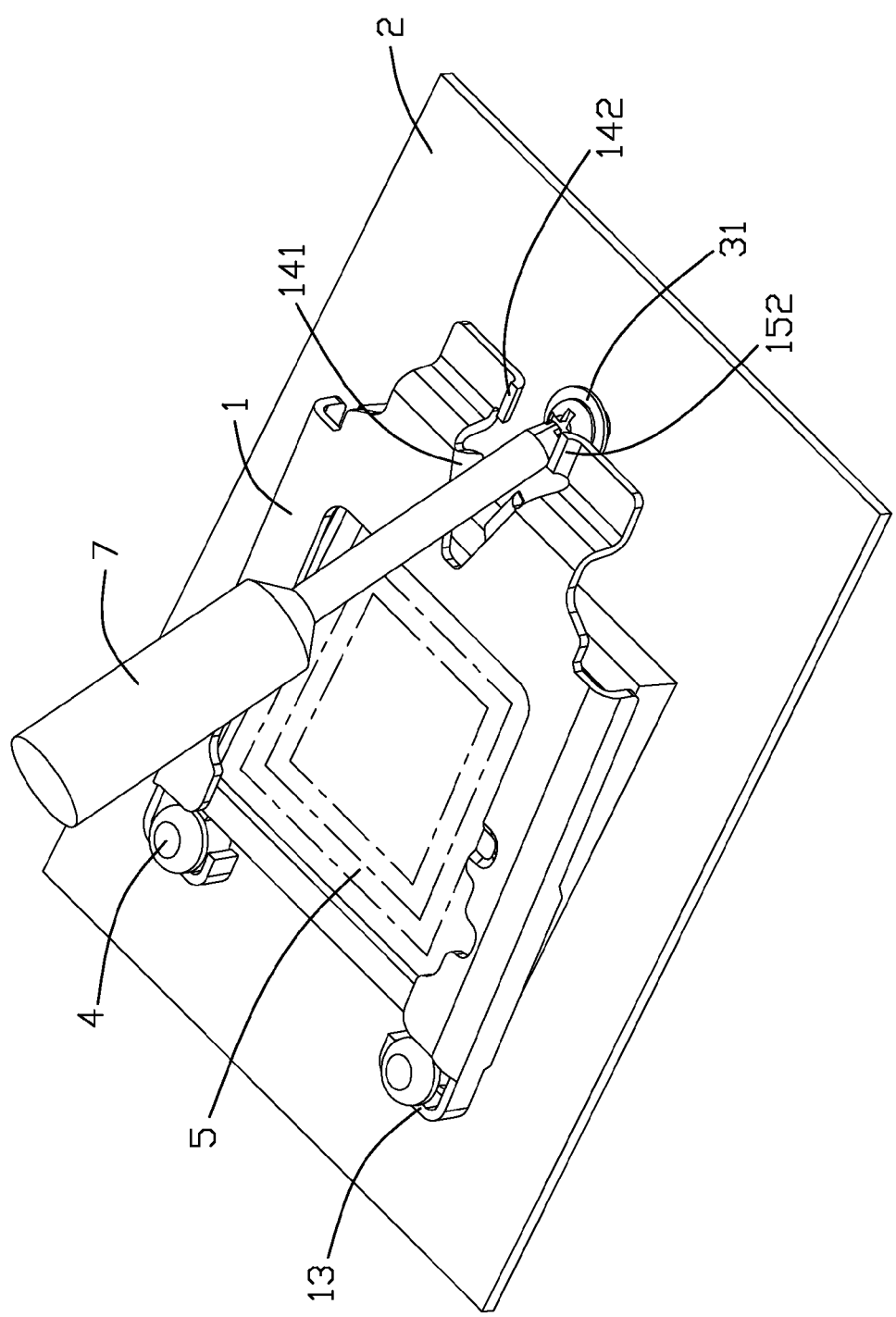
FIG. 2 is an assembled view of the electrical connector assembly shown in FIG. 1, showing the load plate has not locked to the locking device.

Referring to FIG. 2, showing the assembled view of the electrical connector assembly 100, the insulative housing 5 is assembled on the circuit board 2, the load plate 1 covers the insulative housing 5 and the fix member 4 presses on the fasten portion 13 to make the load plate 1 securely located on the circuit board 2. The located plate 1 can rotate about the fasten portion 13. The lock member 3 is securely located on the circuit board 2.

Figure 3:
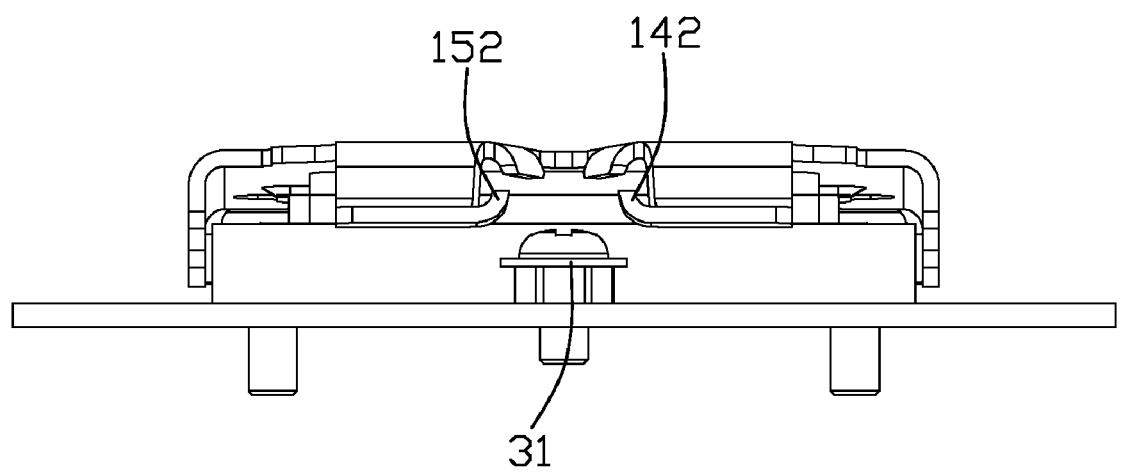
FIG. 3 is a side view of FIG. 2, showing the first interlock portion and the second interlock portion located on the upper of the lock portion of the lock member.
Figure 4:
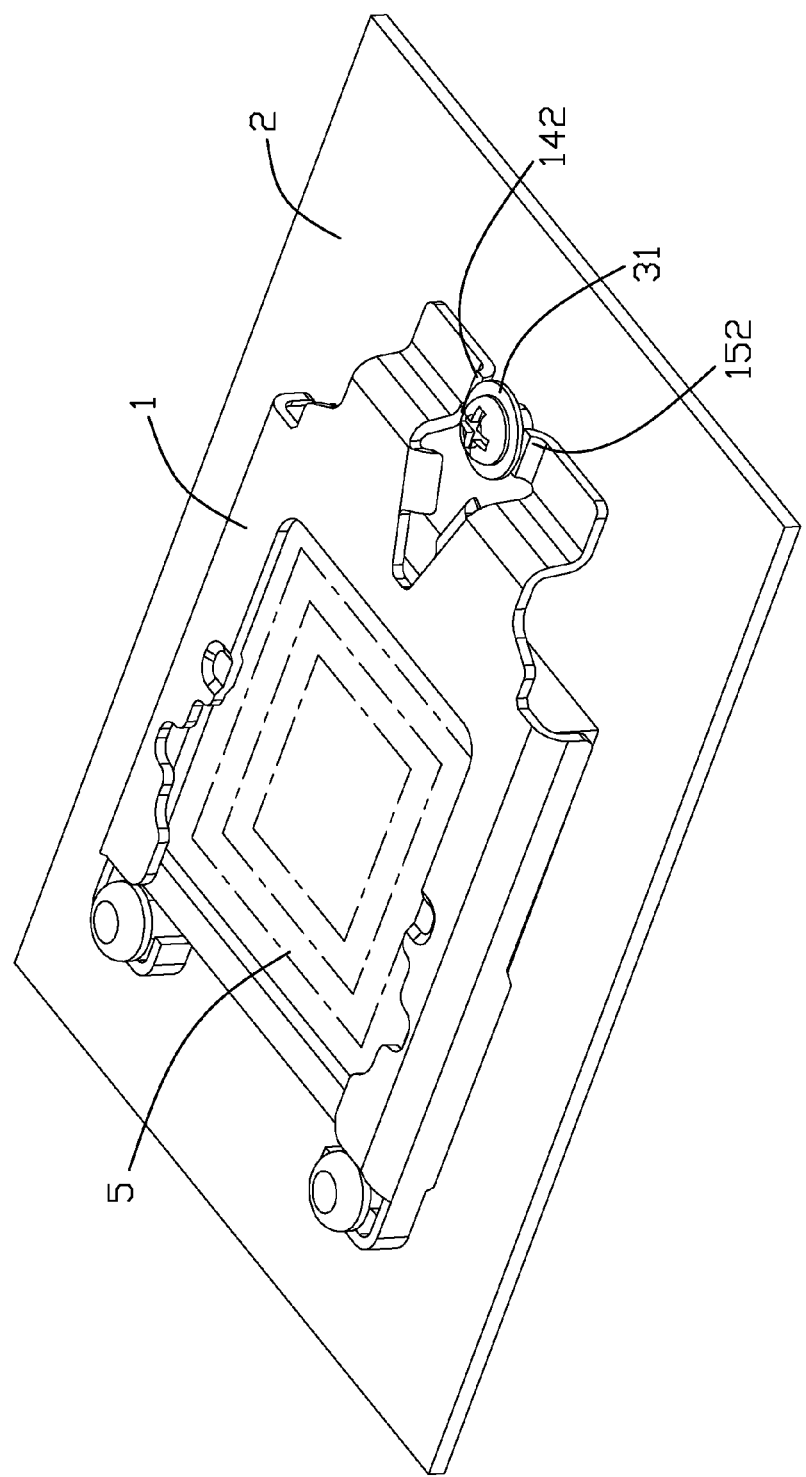
FIG. 4 is similar to FIG. 2, showing the load plate is locked to the locking device.

Referring to FIGS. 2-4, which shows the operating process of the electrical connector assembly 100. When the electronic package is assembled into the receiving space 501 of the insulative housing 5, rotate the load plate 1 to make the load plate 1 naturally cover the insulative housing 5, the first interlock portion 142 and the second interlock portion 152 are located on the upper of the lock member 3. At this position, put a tool 7 on the lock member, then make the tool 7 incline toward the fasten portion 13, the tool 7 will tough and press on the curved surface 1411 of the press portion 141. The first tongue portion 14 and the second tongue portion 15 will move downwardly and away from each other along with the movement of the tool 7 toward the fasten portion 13, then the first interlock portion 142 and the second interlock portion 152 will move to the lower place of the lock portion 31. Then release the tool 7, the first interlock portion 142 and the second interlock portion 152 will move toward each other and interlocked with the lock portion 31, thus make the located plate 1 press on the electronic package.

Figure 5:
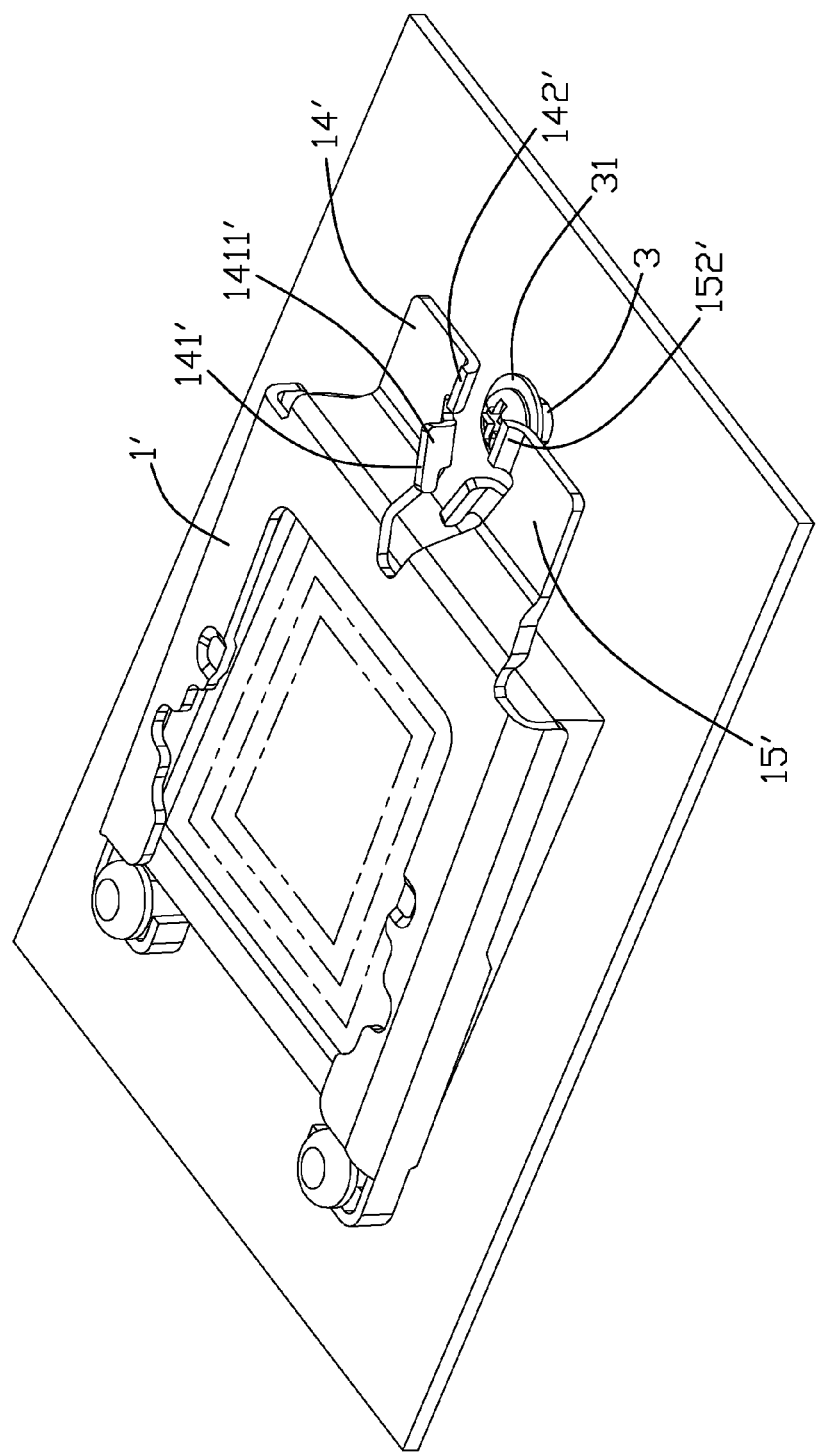
FIG. 5 is an assembled view of a second embodiment of the present invention, showing the load plate has not locked to the locking device.
Figure 6:
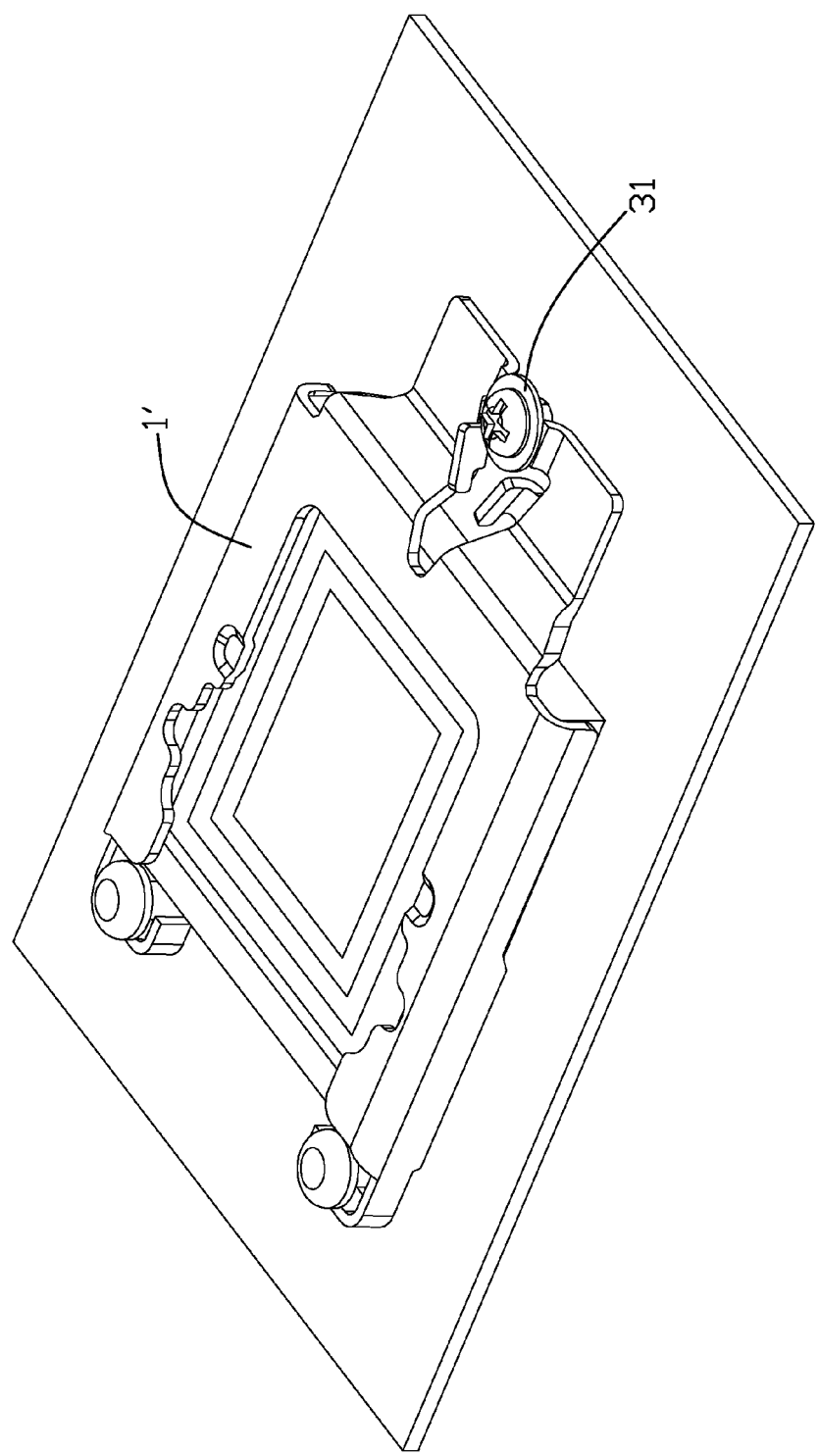
FIG. 6 is similar to FIG. 5, showing the load plate is locked to the locking device.

Referring to FIGS. 5-6, showing a second embodiment of the prevent invention, the difference between the second embodiment and the first embodiment is: the two press portions 141' each extends curvedly and upwardly from the first tongue portion 14' and the second tongue portion 15', the two press portions 141' each defines a curved surface 1411'.

Figure 7:
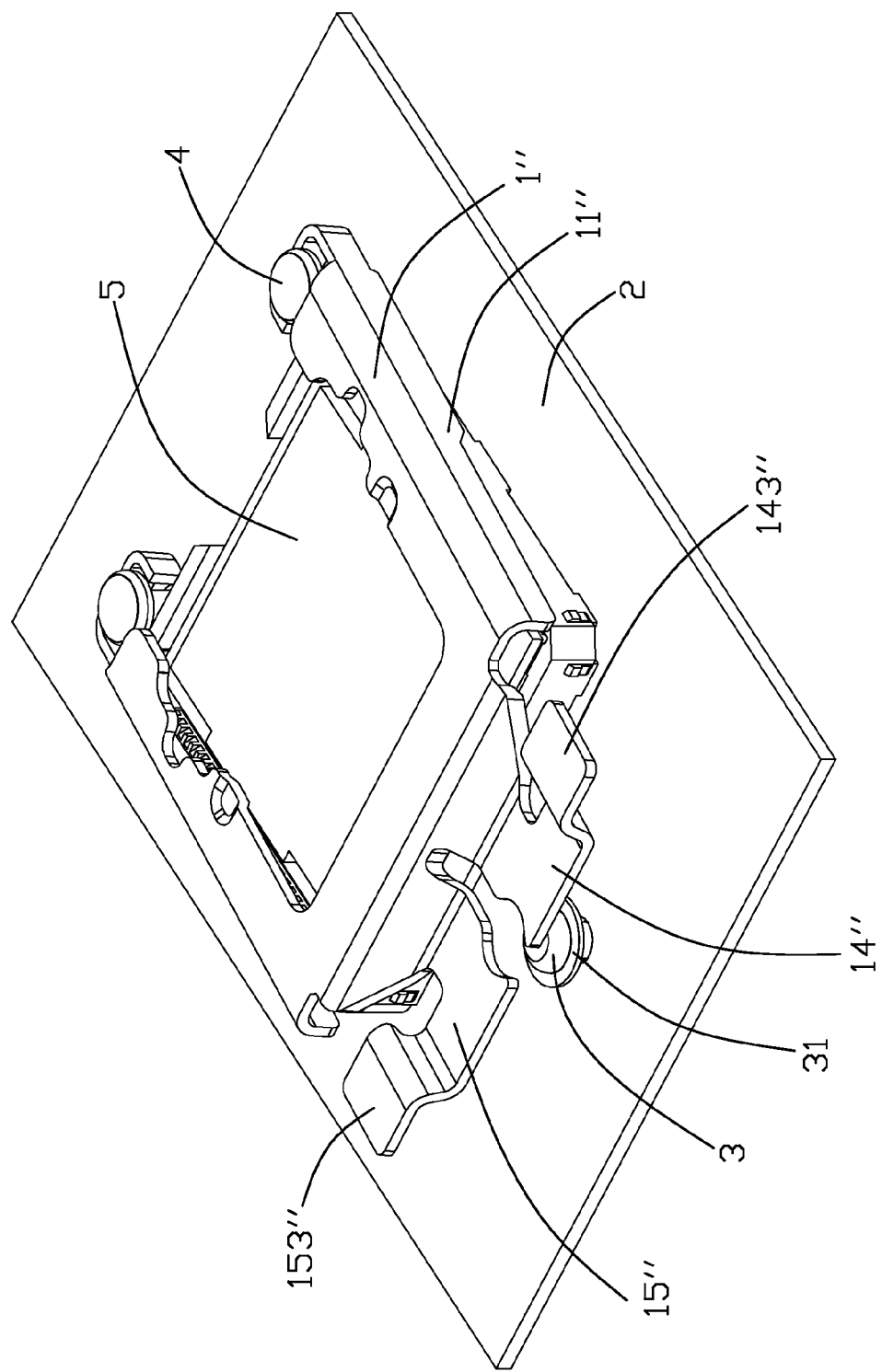
FIG. 7 is an assembled view of a third embodiment of the present invention, showing the load plate has not locked to the locking device.
Figure 8:
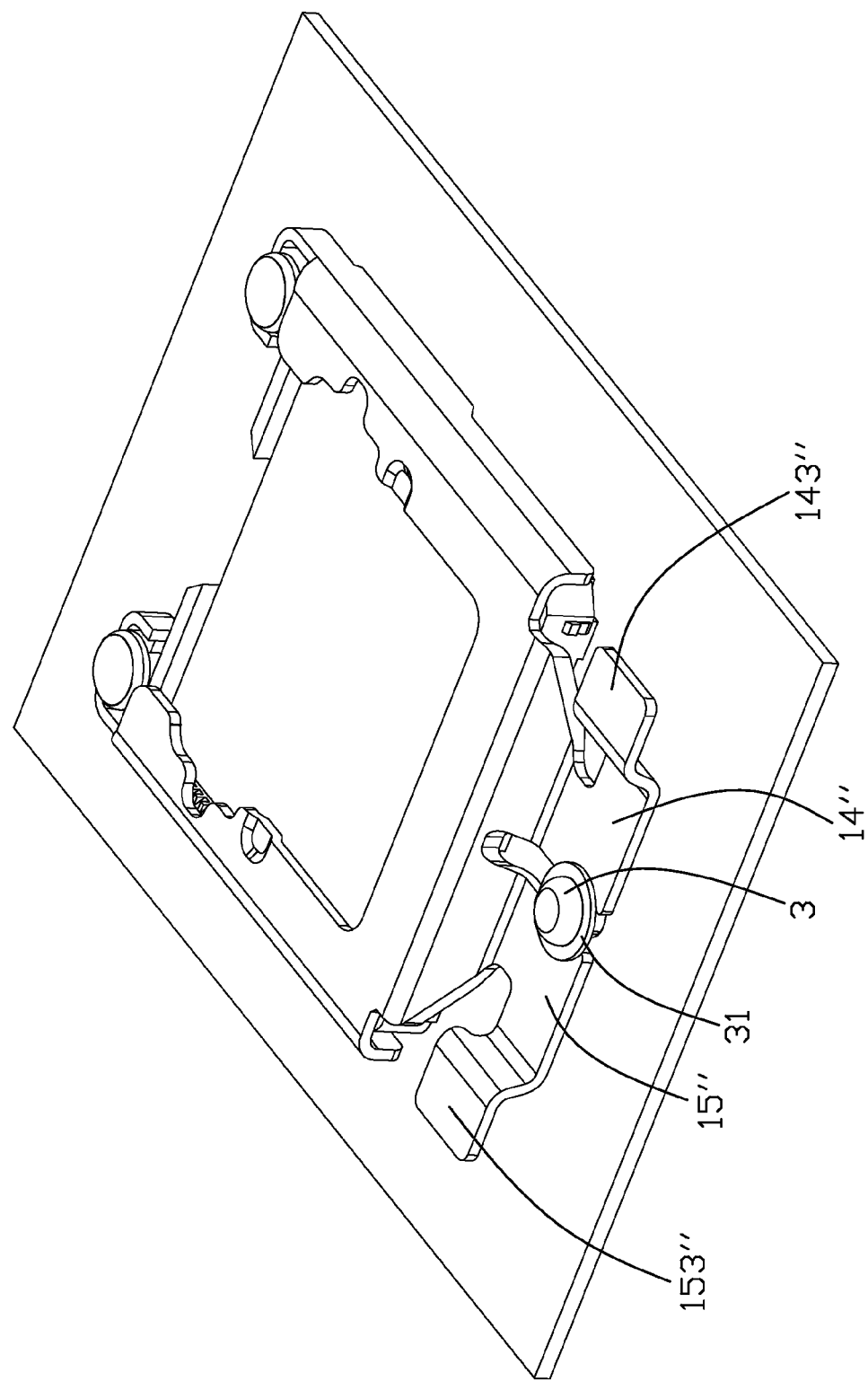
FIG. 8 is similar to FIG. 7, showing the load plate is locked to the locking device.

Referring to FIGS. 7-8, showing a third embodiment of the prevent invention, the difference between the third embodiment and the first embodiment is: the distance between the first tongue portion 14" and the second tongue portion 15" is smaller than the diameter of the lock portion 31. The first tongue portion 14" defines a first hold portion 143" extending upwardly and outwardly to the side plates 11" of the load plate 1". The second tongue portion 15" defines a second hold portion 153" extending upwardly and outwardly to the side plates 11" of the load plate 1". In use, exert a force on the first hold portion 143" and the second hold portion 153" can make the first tongue portion 14" and the second tongue portion 15" move away from each other, then the first tongue portion 14" and the second tongue portion 15" can move to the lower surface of the lock portion 31. Thus, the first tongue portion 14" and the second tongue portion 15" are interlocked with the lock portion 31 to make the load plate 1" press on the electronic package.

In the three embodiments of the prevent invention, the lock portion 31 is configured with a circular shape, thus we say the distance between the first interlock portion 142 and the second interlock portion 152 is smaller than the diameter of the lock portion 31. The lock portion 31 also can be configured to other shape, and the distance between the first interlock portion 142 and the second interlock portion 152 can become larger enough to make the first interlock portion 142 and the second interlock portion 152 move to the lower place of the lock portion 31 when the first tongue portion 14 and the second tongue portion 15 moves away from each other.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An electrical connector assembly for electrically connecting an electronic package with a circuit board, comprising:

an insulative housing with a plurality of contacts received therein; a lock member assembled on the circuit board and defining a lock portion; and a conductive load plate for covering the insulative housing and pressing the electronic package toward the insulative housing, the conductive load plate comprising a body portion, a first tongue portion and a second tongue portion extending from one end of the body portion, the first tongue portion and the second tongue portion can move away from each other to make the first tongue portion and the second tongue portion move to the lower surface of the lock portion and interlock with the lock portion;

wherein the load plate defines a slot between the first tongue portion and a second tongue portion;

wherein the first tongue portion and the second tongue portion each has a press portion extending curvedly and downwardly to the slot;

wherein a tool inserts into said slot and press on the press portion can make the first tongue portion and the second tongue portion move away from each other.

2. The electrical connector assembly as claimed in claim 1, wherein said slot is essentially V-shaped.

* * * * *